(12) United States Patent
Galibois et al.

(10) Patent No.: US 10,114,783 B2
(45) Date of Patent: *Oct. 30, 2018

(54) CONFIGURABLE INPUT/OUTPUT UNIT

(71) Applicant: CAE Inc., Saint-Laurent (CA)

(72) Inventors: Michel Galibois, Rosemere (CA); Yanick Cote, Lachine (CA)

(73) Assignee: CAE Inc., St-Laurent, QC (CA)

( * ) Notice: Subject to any disclaimer, the term of this patent is extended or adjusted under 35 U.S.C. 154(b) by 369 days.

This patent is subject to a terminal disclaimer.

(21) Appl. No.: 14/621,889

(22) Filed: Feb. 13, 2015

(65) Prior Publication Data

US 2015/0278141 A1    Oct. 1, 2015

Related U.S. Application Data

(63) Continuation-in-part of application No. 14/226,535, filed on Mar. 26, 2014, now Pat. No. 8,990,060, and
(Continued)

(51) Int. Cl.
*G06F 17/50*    (2006.01)
*G06F 13/40*    (2006.01)
(Continued)

(52) U.S. Cl.
CPC .......... *G06F 13/4022* (2013.01); *G06F 1/266* (2013.01); *G06F 1/28* (2013.01);
(Continued)

(58) Field of Classification Search
None
See application file for complete search history.

(56) References Cited

U.S. PATENT DOCUMENTS

| 4,608,531 A | 8/1986 | Stephens |
| 5,017,141 A | 5/1991 | Relf et al. |

(Continued)

FOREIGN PATENT DOCUMENTS

| CA | 2835159 A1 | 11/2012 |
| EP | 1571510 A2 | 9/2005 |

(Continued)

OTHER PUBLICATIONS

Anonymous: Programmable Logic Controller—Wikipedia, the free encyclopedia (Mar. 23, 2014), XP055240650 Retrieved from the internet: URL: https://en.wikipedia.org/w/index.php?title=Programmable_logic_controller&oldid=600943701 (retrieved on Jan. 12, 2016)*sections Functionality, Features, System Scale, Redundancy; figure 1*.

*Primary Examiner* — Omar F Fernandez Rivas
*Assistant Examiner* — Cuong V Luu
(74) *Attorney, Agent, or Firm* — Gowling WLG (Canada) LLP; Benoit Yelle

(57) ABSTRACT

Configurable input/output unit and configurable modular card provided therewith. The configurable input/output unit comprises a plurality of configurable inputs and outputs. The plurality of configurable inputs and outputs comprises a predefined output for sending a broadcast message and a predefined input for receiving a broadcast response message. The card comprises a board, at least one processor mounted on the board, at least one memory mounted on the board and in electronic communication with the processor, the configurable input/output unit comprising the plurality of configurable inputs and outputs, and a bus for providing electronic data exchange there between. The processor configures the plurality of inputs and outputs of the configurable input/output unit based on the broadcast response message. The processor may generate testing signals to the
(Continued)

plurality of inputs and outputs of the configurable input/output unit.

20 Claims, 8 Drawing Sheets

Related U.S. Application Data a continuation-in-part of application No. 14/226,691, filed on Mar. 26, 2014, now Pat. No. 9,508,267.

(51) Int. Cl.
*G06F 9/445* (2018.01)
*G06F 1/28* (2006.01)
*G06F 1/26* (2006.01)

(52) U.S. Cl.
CPC ...... *G06F 9/44505* (2013.01); *G06F 13/4068* (2013.01); *G06F 17/5009* (2013.01); *G06F 17/5054* (2013.01)

(56) References Cited

U.S. PATENT DOCUMENTS

| | | | |
|---|---|---|---|
| 5,077,671 A | 12/1991 | Leslie et al. | |
| 5,111,402 A | 5/1992 | Brooks et al. | |
| 5,370,535 A | 12/1994 | Prendergast | |
| 6,232,932 B1 | 5/2001 | Thorner | |
| 6,269,319 B1 * | 7/2001 | Neisch | G01R 31/008 |
| | | | 702/118 |
| 6,270,350 B1 * | 8/2001 | Christopher | G09B 9/00 |
| | | | 434/62 |
| 6,396,169 B1 | 5/2002 | Voegeli et al. | |
| 7,174,467 B1 * | 2/2007 | Helms | G06F 1/3228 |
| | | | 713/300 |
| 7,188,059 B2 * | 3/2007 | White | H04L 67/38 |
| | | | 701/400 |
| 8,323,024 B2 * | 12/2012 | Davidson | G09B 25/00 |
| | | | 367/124 |
| 8,843,660 B1 | 9/2014 | Galibois et al. | |
| 8,868,808 B1 | 10/2014 | Galibois et al. | |
| 2002/0155413 A1 | 10/2002 | Villey | |
| 2003/0211448 A1 | 11/2003 | Quimper et al. | |
| 2003/0211450 A1 | 11/2003 | Sofia et al. | |
| 2003/0214533 A1 | 11/2003 | Cull et al. | |
| 2004/0049610 A1 | 3/2004 | Esterberg et al. | |
| 2010/0333092 A1 * | 12/2010 | Stefansson | G06F 9/44505 |
| | | | 718/100 |
| 2011/0173499 A1 | 7/2011 | Liao et al. | |
| 2011/0231176 A1 | 9/2011 | Sagues | |
| 2013/0144589 A1 | 6/2013 | Levi | |
| 2013/0166271 A1 | 7/2013 | Danielsson et al. | |
| 2016/0197778 A1 * | 7/2016 | Jones | G05B 19/056 |
| | | | 709/222 |
| 2016/0218884 A1 * | 7/2016 | Ebrom | D06F 33/02 |
| 2016/0232366 A1 * | 8/2016 | Van Gorp | G06F 9/455 |

FOREIGN PATENT DOCUMENTS

| | | |
|---|---|---|
| WO | 0055697 A1 | 3/2000 |
| WO | 2002/15517 A2 | 2/2002 |
| WO | 2012/154092 A1 | 11/2012 |

\* cited by examiner

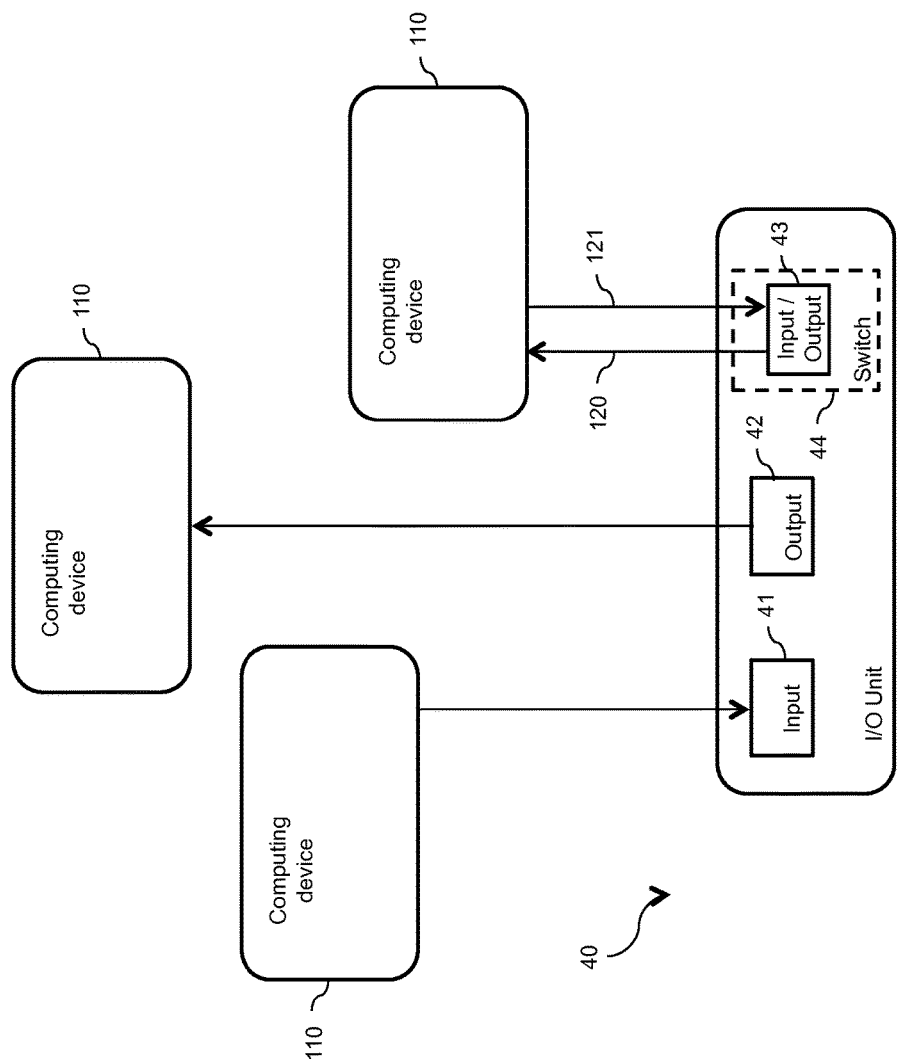

CONFIGURABLE INPUT/OUTPUT UNIT

TECHNICAL FIELD

The present disclosure relates to the field of configurable electronic components. More specifically, the present disclosure relates to a configurable input/output unit, and a configurable modular card provided therewith.

BACKGROUND

An input/output (I/O) unit is a component of an electronic card allowing the electronic card to communicate with external entities, such as computing devices. For instance, a processing unit of the electronic card generates data, which are transmitted to a computing device via the I/O unit. Data can also be received from a computing device by the electronic card via the I/O unit, to be further processed by its processing unit. The I/O unit supports one or several communication protocols (e.g. Ethernet, Wi-Fi, etc.) to communicate with the external entities.

The I/O unit generally operates in pre-defined manner, according to pre-defined operating parameters which can be stored in a memory of the electronic card. However, in various types of applications, such as for example flight simulators, it may be convenient to use generic electronic cards which can be configured to operate in a particular manner to implement specific functionalities. Thus, the same generic electronic card is capable of behaving differently, based on its specific configuration. The specific configuration generally consists in executing a specific software to implement a specific functionality. However, to provide more flexibility in the way the generic electronic card can operate, it may be practical to also have an I/O unit which can be configured.

Therefore, there is a need for a configurable input/output unit, and a configurable modular cad provided therewith.

SUMMARY

According to a first aspect, the present disclosure provides a configurable input/output unit comprising a plurality of configurable inputs and outputs. The plurality of configurable inputs and outputs comprises a predefined output for sending a broadcast message, and a predefined input for receiving a broadcast response message.

According to a second aspect, the present disclosure provides a configurable modular card. The card comprises a board, at least one processor mounted on the board, and at least one memory mounted on the board and in electronic communication with the processor. The card comprises the aforementioned configurable input/output unit. The card comprises a bus electronically connected with the configurable input/output unit, the at least one processor and the at least one memory for providing electronic data exchange there between. The card comprises input/output configuration code stored in the memory. The input/output configuration code, when executed by the at least one processor, configures the plurality of inputs and outputs of the configurable input/output unit based on the broadcast response message.

In a particular aspect, the aforementioned configurable modular card is adapted for being used in a simulator, and further comprises a power supply. The power supply receives an entry power of a predetermined voltage and comprises a plurality of configurable power supply circuits. The card comprises power supply configuration code stored in the memory. The power supply configuration code, when executed by the at least one processor, configures the plurality of power circuits of the power supply based on the broadcast response message.

BRIEF DESCRIPTION OF THE DRAWINGS

Embodiments of the disclosure will be described by way of example only with reference to the accompanying drawings, in which:

FIG. 1A is a block diagram of a configurable input/output unit;

DETAILED DESCRIPTION

Figure 1B:
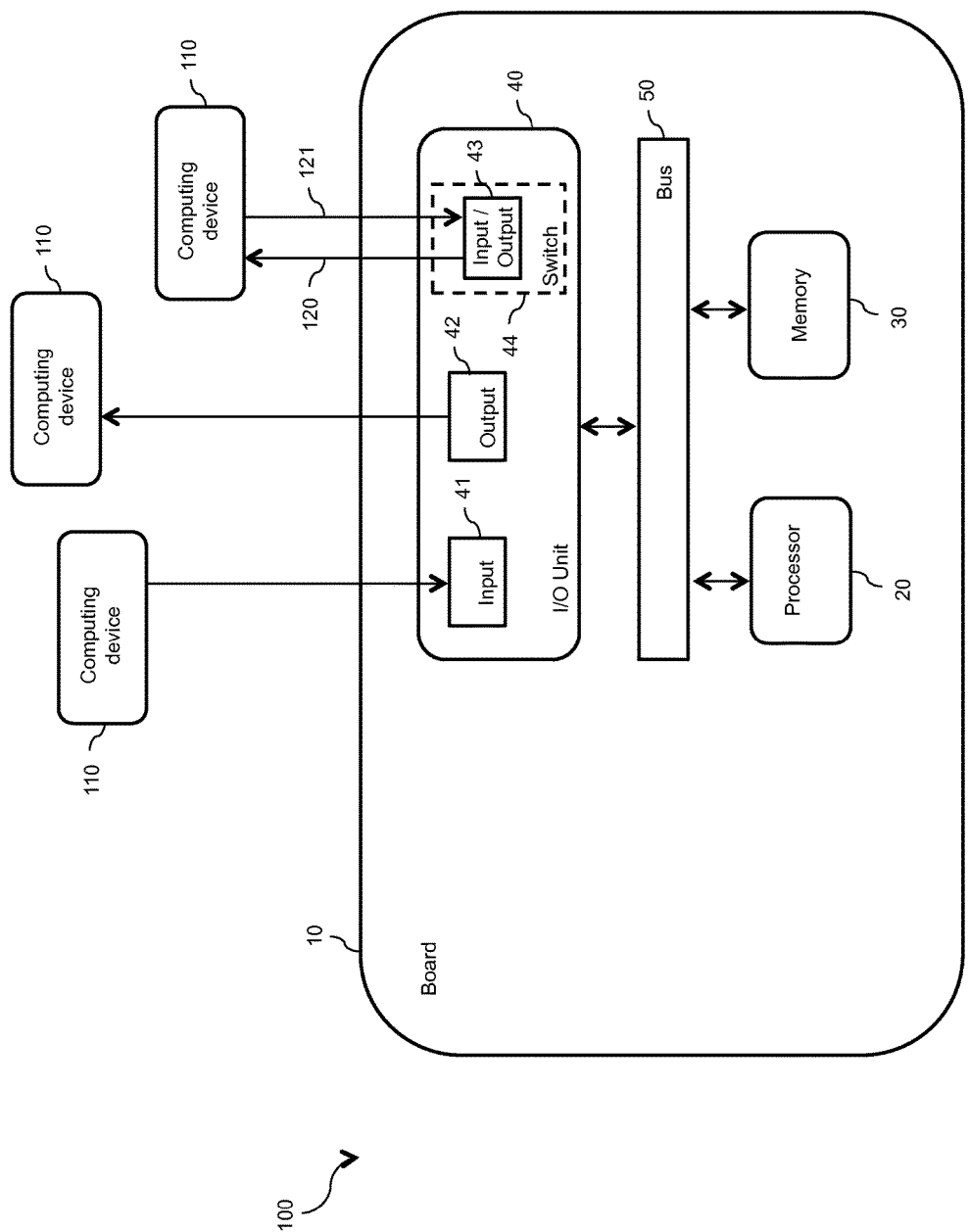
FIG. 1B is a block diagram of a configurable modular card including the configurable input/output unit of FIG. 1A.

The foregoing and other features will become more apparent upon reading of the following non-restrictive description of illustrative embodiments thereof, given by way of example only with reference to the accompanying drawings. Like numerals represent like features on the various drawings.

Various aspects of the present disclosure generally address one or more of the problems of input/output units having configuration capabilities.

Configurable Input/Output Unit

Referring now to FIG. 1A, a configurable input/output (I/O) unit 40 is represented.

The configurable I/O unit 40 comprises a plurality of configurable inputs and outputs. For illustration purposes, the configurable I/O unit 40 represented in FIG. 1A comprises a configurable input 41, a configurable output 42 and a configurable input/output 43. The configurable input 41 is capable of receiving data from one or several computing devices. The configurable output 42 is capable of transmitting data to one or several computing devices. The configurable input/output 43 is capable of exchanging (transmitting and receiving) data with one or several computing devices 110.

The configurable I/O unit 40 may also comprise one or several switches. For example, an optional switch 44 is represented in FIG. 1A. The switch 44 is capable of at least one of the following: switching, multiplexing and de-multiplexing signals exchanged between the configurable input/output 43 and the one or several computing devices 110.

The configurable I/O unit 40 may comprise any number of configurable inputs and outputs. Each configurable input and output of the configurable I/O unit 40 is capable of communicating with a single or with a plurality of computing devices 110.

The configurable inputs and outputs of the configurable I/O unit 40 provide communication capabilities in accordance with one or several types of communication protocols. For instance, the configurable I/O unit 40 may include at least one Ethernet board for receiving/transmitting data via the Ethernet protocol. Alternatively or concurrently, the configurable I/O unit 40 may include an analog or digital input/output, a serial input/output, a USB board, a Wireless Fidelity (Wi-Fi) board for receiving/transmitting data via the Wi-Fi protocol, a cellular board for receiving/transmitting data via a cellular communication protocol (e.g. UMTS, LTE, etc.), a Control Area Network bus, an $I^2$ input/output. The configurable I/O unit 40 may also include a High-Definition Multimedia Interface (HDMI) board, for transmitting video (and audio) data to a screen. Other types of inputs and outputs may be implemented by the configurable I/O unit 40, based on the various types of computing devices 110 with which the configurable I/O unit 40 is exchanging data.

The configurable I/O unit 40 further sends a broadcast message and receives a broadcast response message. The broadcast message may be sent by different outputs of the configurable I/O unit 40 and the broadcast response message may be received by different inputs of the configurable I/O unit 40. Also, different communication protocols may be used for sending the broadcast message and receiving the broadcast response message. In a particular aspect, the configurable I/O unit 40 has a predefined output for sending the broadcast massage and a predefined input for receiving the broadcast response message. In the embodiment illustrated in FIG. 1A, the broadcast message 120 is sent and the broadcast response message 121 is received via input/output 43. Alternatively, the broadcast message 120 may be sent via output 42 and the broadcast response message 121 received via input 41. In another embodiment, the broadcast message 120 may be sent via an Ethernet board of the configurable I/O unit 40, and the broadcast response message 121 may be received via a Wi-Fi board of the configurable I/O unit 40. Alternatively, the broadcast message 120 may be sent via a Wi-Fi board of the configurable I/O unit 40, and the broadcast response message 121 may be received via an Ethernet board of the configurable I/O unit 40.

In a particular embodiment, the broadcast message 120 comprises a configuration request, and the configuration request comprises an identifier. The broadcast message 120 is received by a configuration component of a computing device 110. The configuration component determines configuration parameters based on the identifier of the configuration request. Then, the configuration component transmits the configuration parameters to the configurable I/O unit 40, via the broadcast response message 121 sent to the predefined input. The configuration request may include an identification of the predefined input for receiving the broadcast response message 121. Alternatively, the predefined input is determined by the configuration component (e.g. among a plurality of inputs of the configurable I/O unit 40 memorized by the configuration component).

A broadcast message 120 is used since the configuration component is not necessarily known in advance. By sending the message 120 in a broadcast mode, the configurable I/O unit 40 ensures that the message 120 is received by the configuration component (as well as by other entities). The configuration component receives the broadcast message 120, determines that it is the intended recipient, processes the broadcast message 120, and sends back the broadcast response message 121.

Configurable Modular Card

Referring now to FIG. 1B, a configurable modular card 100 comprising the configurable I/O unit 40 of FIG. 1A is represented.

The card 100 comprises a board 10 and a processor 20 mounted on the board. Although a single processor 20 is represented in FIG. 1B, the card 100 may comprise several processors operating in parallel, as is well known in the art. Additionally, each processor may be a single core or a multicore processor. The at least one processor executes software code stored in a memory 30.

The card 100 also comprises the memory 30 mounted on the board 10 and in electronic communication with the processor 20. Although a single memory 30 is represented in FIG. 1B, the card 100 may comprise several memories or banks of memories. Each memory present on the card 100 may be dedicated to a single processor of the card 100, or may be shared between several processors of the card 100. The memory 30 also stores data generated by the execution of the software code by each processor 20, data received via the configurable I/O unit 40, etc.

The card 100 further comprises the configurable I/O unit 40, which has been previously described in relation to FIG. 1A. The software code executed by the processor 20 may be received through the configurable I/O unit 40.

The configurable I/O unit 40 may comprise any number of configurable inputs and outputs, as long as it is compatible with the size and shape of the board 10, and with the space left by the other electronic components on the board 10.

When the processor 20 executes software code to implement a functionality of the card 100, the processor 20 may process data received by the configurable I/O unit 40 from other computing devices 110, and generate data sent by the configurable I/O unit 40 to other computing devices 110.

The predefined output (for sending the broadcast message) and the predefined input (for receiving the broadcast response message) of the configurable I/O unit 40 may be permanently stored in the memory 30, when the card 100 is manufactured/pre-configured before usage. Upon startup of the card 100, the processor 20 may execute a bootstrap program permanently stored in the memory 30. The bootstrap program includes the sending of the broadcast massage 120 over the memorized predefined output and the receiving of the broadcast response message 121 over the memorized predefined input.

In a particular embodiment, the identifier included in the configuration request comprised in the broadcast message 120 consists of an identification of the card 100 (e.g. a serial number). The identifier may further include an identification of the predefined input (e.g. an Ethernet or an Internet Protocol (IP) address). The broadcast message 120 is received by a configuration component of a computing device 110. The configuration component determines configuration parameters based on the identification of the card 100. Then, the configuration component transmits the configuration parameters to the card 100, via the broadcast response message 121 sent to the predefined input. The predefined input may be identified via the identifier included in the configuration request, if the identifier includes the identification of the predefined input. The configuration component may determine the configuration parameters based on many possible variants (e.g. replacement card needed, processing capability required, software code executed by the processor 20, physical I/O capacity, etc.). The configuration parameters may also include a list of other configurable modular cards with which the card 100 needs to communicate to implement a particular functionality of the software code executed by the processor 20.

The card 100 also comprises a bus 50, electronically connected with the configurable I/O unit 40, with the at least one processor 20 of the board 10, and with the at least one memory 30 of the board 10. The bus 50 provides electronic data exchange there between. For example, the processor 20 reads data in the memory 30 via the bus 50, processes the data, and transmits the processed data via the bus 50 to the configurable I/O unit 40 (for further transmission by an output of the configurable I/O unit 40 to a computing device 110). Similarly, the processor 20 receives data from the configurable I/O unit 40 (the data was received by an input of the configurable I/O unit 40 from a computing device 110) via the bus 50, processes the data, and transmits the processed data via the bus 50 to the memory 30 for memorization therein.

Input/output (I/O) configuration code (not represented in FIG. 1B) is stored in the memory 30. The I/O configuration code is executed by the processor 20, to configure the plurality of inputs and outputs (e.g. 41, 42 and 43) of the configurable I/O unit 40 based on the received broadcast response message 121.

The configuration of the configurable I/O unit 40 may include a network configuration of its inputs and outputs. Network configuration is well known in the art, and depends on the specific types of inputs and outputs, and on the specific types of communication protocols they support. For instance, the configuration of an Ethernet input/output may include the configuration of its IP address. The configuration of a Wi-Fi input/output may include the configuration of a Service Set Identifier (SSID) and a wireless key, as well as its IP address. In these examples, the IP address, SSID and wireless keys are network configuration parameters transmitted to the card 100 via the broadcast response message 121.

The configuration of the configurable I/O unit 40 may include a functional configuration of its inputs and outputs. For instance, a first sub-functionality of the card 100 is associated with a first input/output. All data exchanged with specific computing device(s) 110 when executing the first sub-functionality are transmitted and received with the first input/output. Another sub-functionality of the card 100 is associated with a second input/output. All data exchanged with other specific computing device(s) 110 when executing the second sub-functionality are transmitted and received with the second input/output. For example, the configurable I/O unit 40 may have two video outputs. A first video output is connected to a video screen of a first user and the second video output is connected to a video screen of a second user. The processor 20 runs software code, which generates specific video data for the first user (first sub-functionality) and specific video data for the second user (second sub-functionality). The received broadcast response message 121 provides the following configuration: specific video data for the first user shall be transmitted via the first video output and specific video data for the second user shall be transmitted via the second video output.

The I/O configuration code may be permanently stored in the memory 30, when the card 100 is manufactured/pre-configured before usage. Upon startup of the card 100, the processor 30 may execute the I/O configuration code, after reception of the broadcast response message 121. The I/O configuration code may also be executed at other moments: after a reset of the card 100, after a failure (software or hardware) of the card 100 requiring a complete reconfiguration, etc. The configuration parameters of the configurable I/O unit 40, received via the broadcast response message 121, can be permanently stored in the memory 30, to be available to the I/O configuration code at any time.

Alternatively, the I/O configuration code may not be initially present in the memory 30, but downloaded from an external entity (e.g. one of the computing devices 110) and stored in the memory 30 for further use. The predefined output and the predefined input (e.g. 43) of the configurable I/O unit 40 can be used for performing the download of the I/O configuration code. Broadcast message 120/broadcast response message 121 can be used for this purpose; or additional broadcast message/broadcast response message dedicated to the download of the I/O configuration code can be used.

I/O testing code (not represented in FIG. 1B) may also be stored in the memory 30. The I/O testing code is executed by the processor 20 to generate testing signals to the plurality of inputs and outputs of the configurable I/O unit 40 configured based on the broadcast response message 121.

The testing signals generated to the plurality of inputs and outputs of the configurable I/O unit 40 allow a verification that the inputs and outputs are operating in conformance with the configuration parameters received via the broadcast response message 121. The verification may include a verification of the network configuration of the inputs and outputs. For instance, the testing signals may permit a determination that a specific input or a specific output are respectively capable of receiving and transmitting data, at a specified throughput, with a specified delay, with a specified packet loss rate, etc. The verification may also include a verification of the network connectivity of the inputs and outputs with specific computing devices 110.

Similarly to the I/O configuration code, the I/O testing code may be permanently stored in the memory 30, when the card 100 is manufactured/pre-configured before usage. Alternatively, the I/O testing code may not be initially present in the memory 30, but downloaded from an external entity (e.g. one of the other simulation components 110) and stored in the memory 30 for further use.

If several processors are mounted on the board 10, the I/O configuration code and the I/O testing code may be executed by the same processor 20 or by different processors 20. Additionally, the I/O testing code may be divided in multiple functional modules executed by different processors 20 operating in parallel.

Configurable Modular Card Adapted for Use in a Simulator

The simulators mentioned in the present disclosure may be used for different simulation purposes. For example, a first type of simulator may consist of a vehicular simulator, such as an aircraft simulator, a terrestrial vehicle simulator, a boat simulator, an underground simulator, a mining simulator or a nuclear plant simulator.

A simulator is a complex system generally comprising a plurality of components. A first type of component consists of a computing component, comprising a processor for executing specific simulation software (simulation software and simulation code are used interchangeably in the present disclosure). A computing component generally receives data, processes the received data by means of the specific simulation software to generate new data, and transmits the new data. A computing component may also be capable of interacting with one or several dedicated hardware components, such as sensors, mechanical actuators, pneumatic actuators, hydraulic actuators, displays, switches, lights, electric components, etc. The computing component may receive data from a dedicated hardware component and/or send commands to the dedicated hardware component (e.g. receive data from a sensor and send actuating commands to an actuator). The computing components also exchange data with each other, to execute and synchronize the simulation.

The simulator is generally implemented as a plurality of sub-systems for implementing a plurality of functionalities of the simulator. Each sub-system comprises a plurality of computing components and a plurality of dedicated hardware components. The computing components are centrally controlled by one or several dedicated entities having a processor executing control software. The computing components are usually implemented by dedicated cards, each dedicated card having specific electronic components designed to implement a specific functionality or sub-functionality of the simulator. Additionally, each dedicated card may only be capable of executing dedicated software stored in a memory of the dedicated card. Thus, when such a dedicated card is not operating properly, the only alternative is to repair the dedicated card (possibly interrupting the simulation) or to replace the dedicated card with the exact same type of dedicated card (which may not be available immediately or may be very expensive).

The present disclosure introduces a configurable modular card, which can be configured to play the role of several of the aforementioned computing components. Thus, the simulator is no longer dependent on multiple dedicated cards, which are replaced by instances of the configurable modular card. The configurable modular card comprises several configurable electronic components (such as a configurable input/output unit, a configurable power supply). The simulation software executed by a particular configurable modular card is also configurable. The configurable modular cards are configured and controlled by one or several dedicated entities having a processor executing configuration and control software. Thus, when a specific configurable modular card implementing a critical functionality of the simulator is not operating properly, another configurable modular configurable card of the simulator can be reconfigured to implement the critical functionality in place of the defective card.

Figure 6:
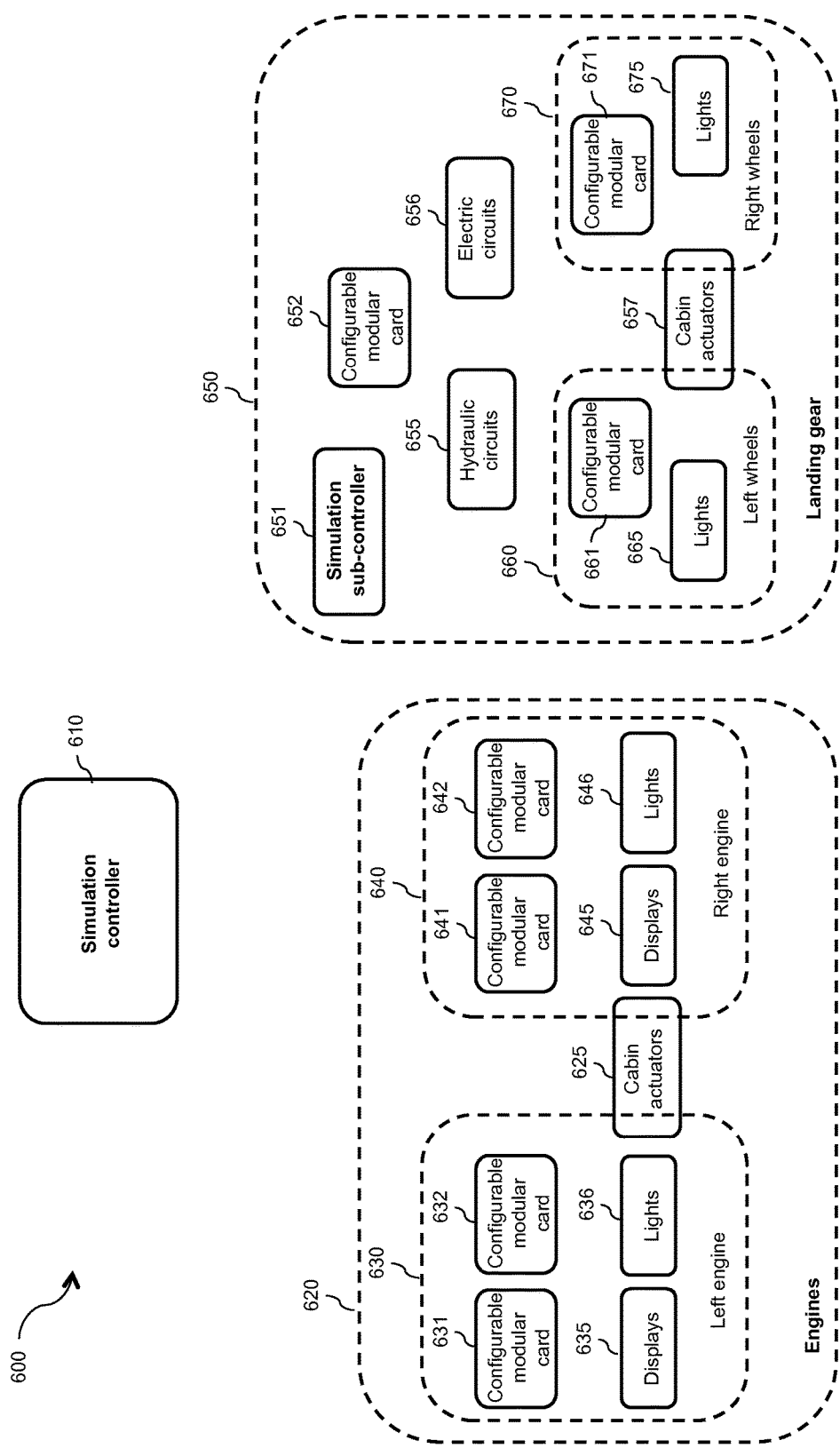
FIG. 6 illustrates an exemplary flight simulator including several of the configurable modular cards of FIG. 1C.

FIG. 6 illustrates an exemplary flight simulator 600 including a simulation controller 610 and several configurable modular cards (631, 632, 641, 642, 652, 661 and 671). The configurable modular cards hierarchically implement two exemplary sub-systems (engines 620 and landing gear 650) of the flight simulator 600. FIG. 6 will be described with more details later in the description.

Figure 1C:
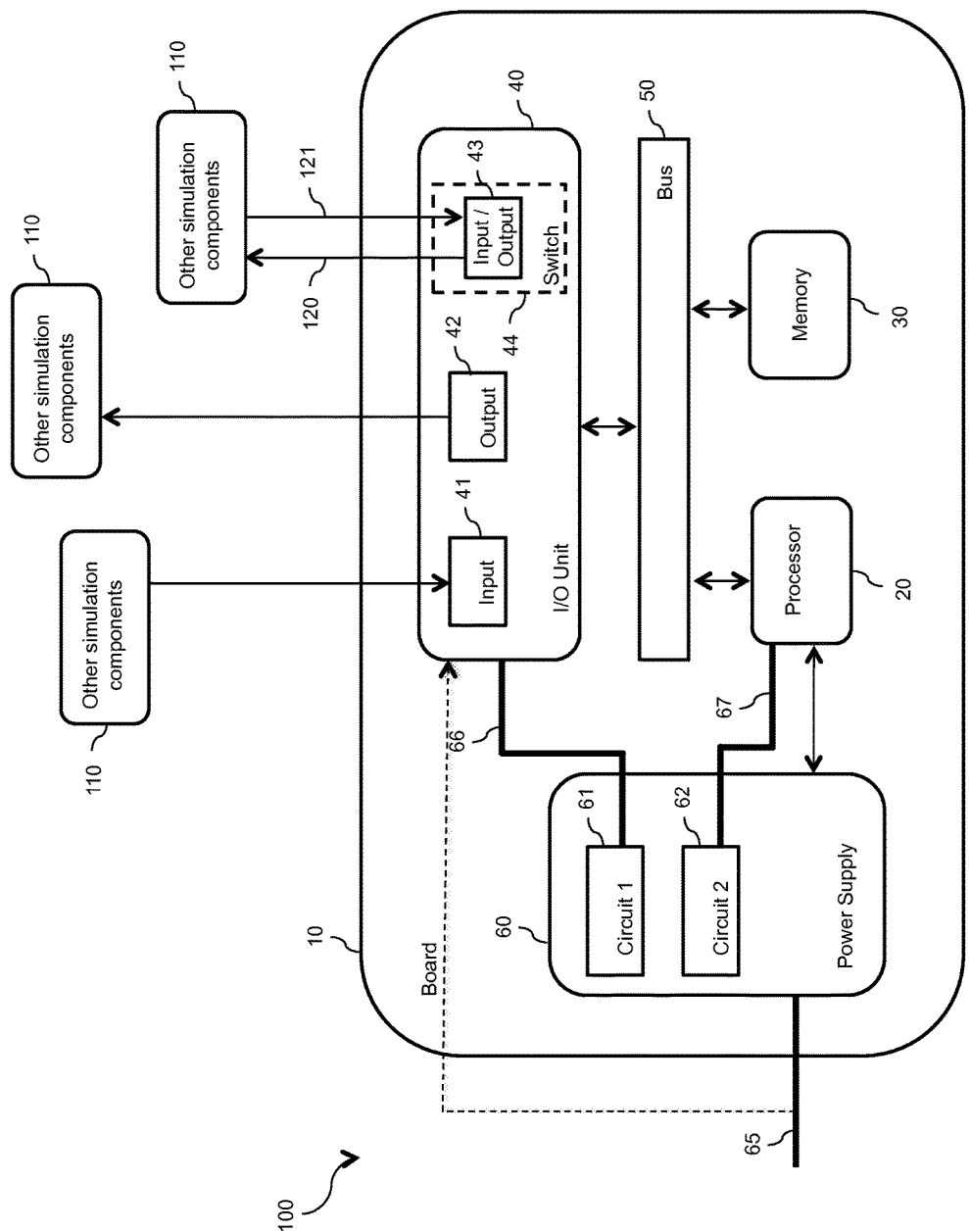
FIG. 1C is a block diagram of the configurable modular card of FIG. 1B adapted for being used in a simulator.

Referring now to FIG. 1C, a configurable modular card 100 similar to the card of FIG. 1B, and adapted for use in a simulator, is represented.

The card 100 comprises all the components described in relation to FIG. 1B (board 10, configurable I/O unit 40, processor(s) 20, memory 30, and bus 50). In addition, the card 100 comprises a power supply 60.

The at least one processor 20 executes a simulation code, or a portion of the simulation code, to implement a functionality of the simulator. Examples of functionalities of the simulator include without limitation: simulating information displayed on a display, simulating a motion of an aircraft, simulating electric circuits of an aircraft, simulating hydraulic circuits of an aircraft, simulating a heartbeat, simulating a bodily function, and/or any other type of simulation code known. The simulation code executed by the processor 20 may be received through the configurable I/O unit 40.

The plurality of configurable inputs and outputs of the configurable I/O unit 40 are capable of exchanging data (transmitting and/or receiving) with one or several other simulation components 110. Each configurable input and output of the configurable I/O unit 40 is capable of communicating with a single or with a plurality of other simulation components 110, such as for example: panel, electronics, sensors, motors and actuators and/or guidance of any type of aircraft or vehicle, aircraft avionics, etc.

When the processor 20 executes a simulation code to implement a functionality of the simulator, the processor 20 may process data received by the configurable I/O unit 40 from other simulation components 110, and generate data sent by the configurable I/O unit 40 to other simulation components 110.

The previously mentioned configuration parameters of the broadcast response message 121 may include a list of the other configurable modular cards with which the card 100 must communicate to perform the simulation. For example, the configuration parameters may include a list of cards and their corresponding sub-functionalities, so that the card 100 may communicate directly with the other cards upon execution of the simulation, by identifying that a specific sub-functionality is performed by a specific card from the list. The configuration parameters may also include a list of dedicated hardware components with which the card 100 must communicate to perform the simulation. One of the other simulation components 110 represented in FIG. 1C may implement the configuration component.

As mentioned previously, the configuration of the plurality of inputs and outputs of the configurable I/O unit 40 may comprise determining which inputs and outputs are used to receive and/or send data related to a specific sub-functionality of the simulator.

The card 100 also comprises the power supply 60. The power supply 60 receives an entry power 65 of a predetermined voltage, and comprises a plurality of configurable power supply circuits. For illustration purposes, the power supply 60 represented in FIG. 1C comprises two configurable power supply circuits 61 and 62. The power supply 60 may comprise any number of configurable power supply circuits, as long as it is compatible with the size and shape of the board 10, and with the space left by the other electronic components on the board 10.

A configurable power supply circuit provides power to one or several electronic components of the card 100. Additionally, some of the configurable power supply circuits may provide power to electronic components of one or several other simulation components 110. For illustration purposes, the configurable power supply circuit 61 represented in FIG. 1C provides power 66 to the configurable I/O unit 40 and the configurable power supply circuit 62 provides power 67 to the processor 20. Depending on implementation preferences or the capabilities of the power supply 60 or of the power needs of the other components powered by the card 100, components which use power with the same voltage and current as the entry power 65, may directly receive power from the entry power 65 instead of going through the power supply 60 as exemplified by the dotted line between the entry power 65 and the I/O unit 40. Although not represented in FIG. 1C for simplification purposes, the configurable power supply circuits 61 and 62 may also provide power to the bus 50, the memory 30, and to other simulation component(s) 110. Alternatively, additional configurable power supply circuit(s) may be used to provide power to the bus 50, the memory 30, and to other simulation component(s) 110. For example, the other simulation component(s) 110 may consist of one or several screens for displaying data, the screens receiving power from at least one of the configurable power supply circuit(s) of the power supply unit 60.

Power supply configuration code (not represented in FIG. 1C) is stored in the memory 30. The power supply configuration code is executed by the processor 20, to configure the plurality of power circuits (e.g. 61 and 62) of the power supply 60 based on the received broadcast response message 121.

The configuration of each specific power circuit may consist of a specific amperage (the voltage is similar to the entry power 65), a specific voltage (the amperage is similar to the entry power 65), pulse-width modulated power, or a specific combination of amperage and voltage, for the power delivered by the specific power circuit. If a power circuit has several outputs for delivering power to several entities, each power output may be configured individually.

The broadcast response message 121 comprises power configuration parameters (e.g. amperage and/or voltage) for each configurable power circuit of the power supply 60. In the embodiment illustrated in FIG. 1C, the same broadcast message 120/broadcast response message 121 is/are used for configuring the configurable I/O unit 40 and the power supply 60. Alternatively, a dedicated broadcast message/broadcast response message may be used for respectively configuring the configurable I/O unit 40 and the power supply 60.

One or several power circuits of the power supply 60 may have a default configuration, to allow proper operations of the card 100 until the broadcast response message 121 comprising the power configuration parameters is received. The default configuration of some of the power circuits may be overridden by the received power configuration parameters, while the default configuration of some of the power circuits may be maintained.

The power supply configuration code may be permanently stored in the memory 30, when the card 100 is manufactured/pre-configured before usage. Upon startup of the card 100, the processor 30 may execute the power supply configuration code, after reception of the broadcast response message 121. The power supply configuration code may also be executed at other moments: after a reset of the card 100, after a failure (software or hardware) of the card 100 requiring a complete reconfiguration, etc. The configuration parameters of the power supply 60, received via the broadcast response message 121, can be permanently stored in the memory 30, to be available to the power supply configuration code at any time.

Alternatively, the power supply configuration code may not be initially present in the memory 30, but downloaded from an external entity (e.g. one of the other simulation components 110) and stored in the memory 30 for further use. The predefined output and the predefined input (e.g. 43) of the configurable I/O unit 40 can be used for performing the download of the power supply configuration code. Broadcast message 120/broadcast response message 121 can be used for this purpose; or additional broadcast message/broadcast response message dedicated to the download of the power supply configuration code can be used.

Power supply testing code (not represented in FIG. 1C) is stored in the memory 30. The power supply testing code is executed by the processor 20 to generate testing signals to the plurality of power circuits of the power supply 60 configured based on the broadcast response message 121.

The testing may include a continuous verification of voltage condition and current condition. For this purpose, the testing signals generated to the plurality of power circuits of the power supply 60 allow a verification that the power circuits are operating in conformance with the configuration parameters received via the broadcast response message 121. For instance, the testing signals may permit a determination that a specific power circuit is operating at a specified voltage and/or amperage.

Similarly to the power supply configuration code, the power supply testing code may be permanently stored in the memory 30, when the card 100 is manufactured/pre-configured before usage. Alternatively, the power supply testing code may not be initially present in the memory 30, but downloaded from an external entity (e.g. one of the other simulation components 110) and stored in the memory 30 for further use.

If several processors are mounted on the board 10, the power supply configuration configurations code and the power supply testing code may be executed by the same processor or by different processors. Additionally, the power supply testing code may be divided in multiple functional modules executed by different processors operating in parallel.

Configurable Simulator with a Plurality of Configurable Modular Cards

Figure 2:
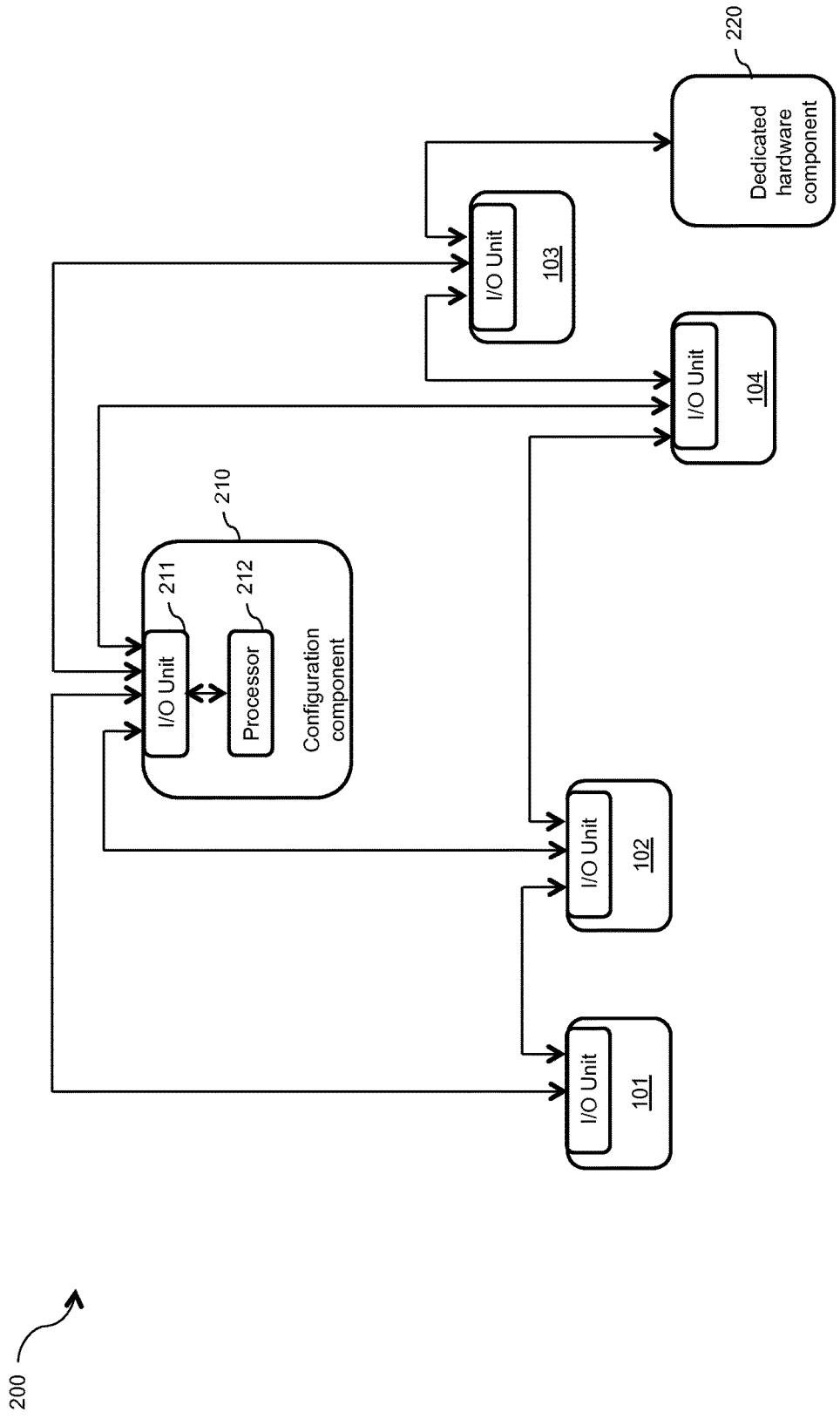
FIG. 2 is a block diagram of a configurable simulator including several of the configurable modular cards of FIG. 1C, according to a first aspect.

Referring now concurrently to FIGS. 1C and 2, a configurable simulator 200 with a plurality of configurable modular cards is represented.

The simulator 200 comprises a configuration component 210 and a plurality of configurable modular cards 101, 102, 103 and 104. The plurality of configurable modular cards 101, 102, 103 and 104 are instances of the configurable modular card 100, which has been previously described with reference to FIGS. 1A, 1B and 1C. Although four instances of the configurable modular card 100 have been represented in FIG. 2, the simulator 200 may comprise any number of these cards.

The configuration component 210 includes an input/output (I/O) unit 211 and a processor 212. The configuration component 210 may include additional electronic components, such as additional processors, at least one memory, a bus, a power unit; not represented in FIG. 2 for simplification purposes.

The configuration component 210 configures the plurality of configurable modular cards 101, 102, 103 and 104. The configuration of instances of the configurable modular card 100 has been previously described with reference to FIGS. 1A, 1B and 1C. Each configurable modular card (e.g. 101) sends a broadcast message (on a predefined output of its configurable I/O unit 40) to the configuration component 210. The broadcast message is received by the I/O unit 211 of the configuration component 210 and transmitted to the processor 212. Although FIG. 2 shows physical connections between the various I/O units, the connections there between could be logical connections, and/or wireless connections. The processor 212 determines configuration parameters for the configurable modular card (e.g. 101) and transmits the configuration parameters to the I/O unit 211. The I/O unit 211 sends a broadcast response message with the configuration parameters to the configurable modular card (e.g. 101). The broadcast response message is received on a predefined input of the configurable I/O unit 40 of the configurable modular card (e.g. 101).

The processor 20 of each configurable modular card (e.g. 101) executes its I/O configuration code to configure the plurality of inputs and outputs of its configurable input/output unit 40 based on the received broadcast response message.

The processor 20 of each configurable modular card (e.g. 101) executes its power supply configuration code to configure the plurality of power circuits of its power supply 60 based on the received broadcast response message.

The simulator 200 may comprise more than one configuration component 210. For instance, the configuration component 210 may be responsible for configuring the configurable modular cards 101 and 102, and another configuration component (not represented in FIG. 2) may be responsible for configuring the configurable modular cards 103 and 104. Furthermore, a configuration component may be implemented by a configurable modular card 100. For example, the configurable modular card 103 may be configured by the configuration component 210, and implement the functionality of a configuration component for the configurable modular card 104.

When a configurable modular card (e.g. 101) of the simulator 200 is configured, its processor 20 is capable of executing a simulation code to implement a functionality of the simulator 200. Its configurable I/O unit 40 is capable of exchanging (receiving and sending) data with at least one other simulation component. Executing the simulation code to implement the functionality of the simulator 200 comprises processing the data received by the configurable I/O unit 40 and generating the data sent by the configurable I/O unit 40. The specific inputs and outputs of the configurable I/O unit 40 used for exchanging a specific type of communication data or for communicating with a specific other simulation component are determined by the I/O configuration code executed by the processor 20.

The other simulation component may consist of another configurable modular card 100 or of a dedicated hardware component 220 (e.g. a display, a light, a mechanical actuator, etc.) different from the configurable module card 100. For example, as illustrated in FIG. 2, the configurable modular card 101 exchanges data with the configurable modular card 102. The configurable modular card 102 exchanges data with the configurable modular cards 101 and 104. The configurable modular card 103 exchanges data with the configurable modular cards 104 and the dedicated hardware component 220. The configurable modular card 104 exchanges data with the configurable modular cards 102 and 103.

A dedicated hardware component (e.g. 220) such as a display, a light, a mechanical actuator, is under the control of one or several configurable modular cards (e.g. 103). In this case, the data exchanged there between consist of commands generated by the simulation software executed by the processor 20 of the configurable modular cards (e.g. 103). The commands are sent to the dedicated hardware component (e.g. 220) to trigger an event representative of the current state of the simulation. Such events may comprise: displaying data on a display, switching on or off a light, activating a mechanical actuator (e.g. to move a seat in which a trainee is sitting), controlling analog gauge (to actuate a gauge for equipment such as for example an altimeter, a pump gauge, a compressor gauge, etc.). Alternatively, a dedicated hardware component (e.g. 220) may consist of a sensor, and the data exchanged between the sensor and one or several configurable modular cards (e.g. 103) consist in data collected by the sensor and sent to the configurable modular card(s).

The power supply configuration code executed by the processor 20 of a configurable modular card (e.g. 103) configures the power supply circuits of its power unit 60 to deliver power to electronic components (e.g. processor 20, configurable I/O unit 40) of the configurable modular card (e.g. 103). More specifically, the configuration comprises determining at least one of specific amperage or a specific voltage of the power delivered to a specific electronic component. Additionally, some of the power supply circuits of the power unit 60 may be configured to deliver power to electronic components of another entity. For instance, some of the power supply circuits of the power unit 60 of the configurable modular card 103 may be configured to deliver power to electronic components of the configurable modular card 104 or to electronic components of the dedicated hardware component 220.

Configurable Simulator with Distributed Simulation Capabilities

Figure 3:
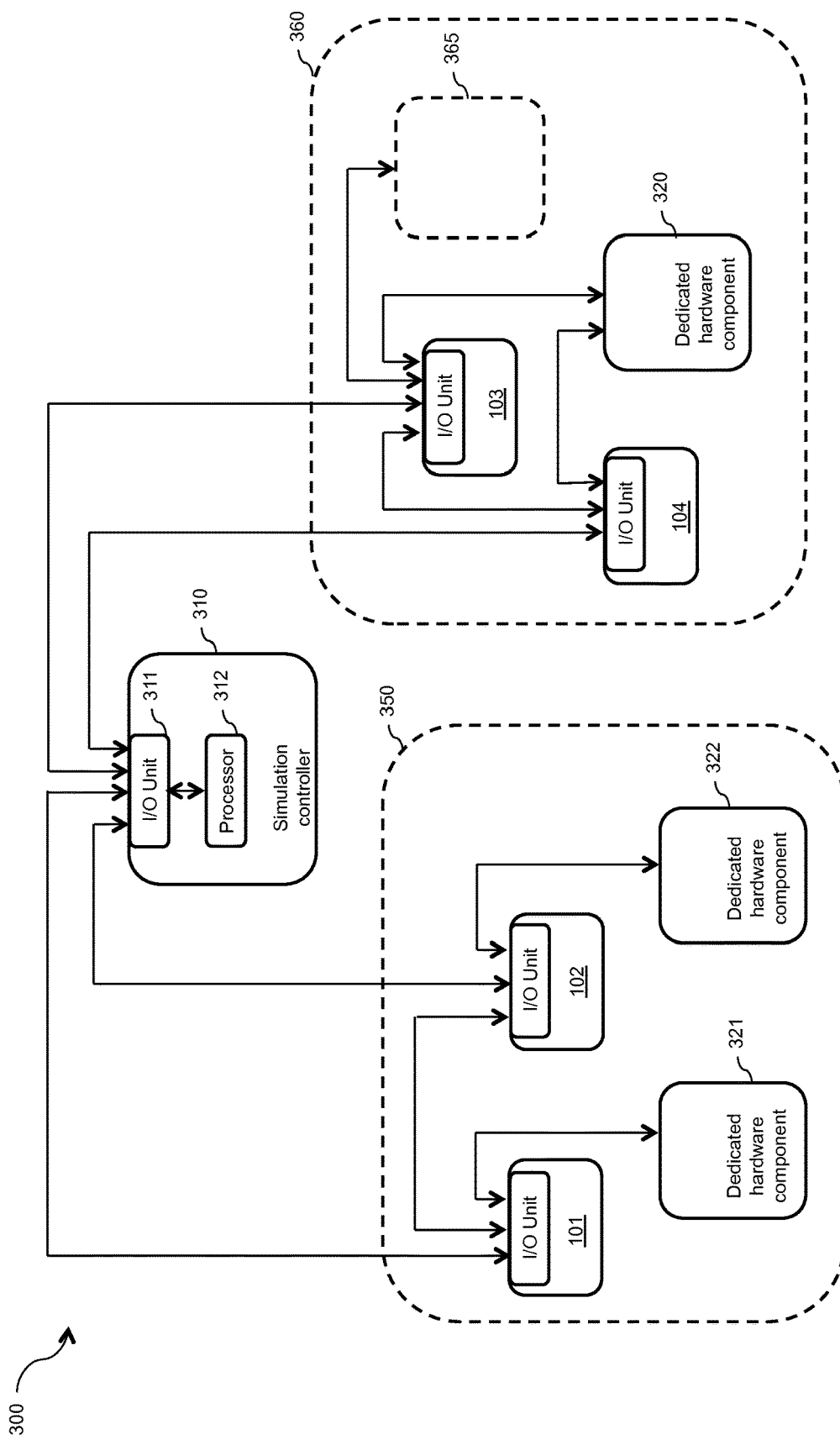
FIG. 3 is a block diagram of a configurable simulator including several of the configurable modular cards of FIG. 1C, according to another aspect.

Referring now concurrently to FIGS. 1C and 3, a configurable simulator 300 comprising a plurality of configurable modular cards for performing a distributed simulation is represented.

The simulator 300 comprises a simulation controller 310 and a plurality of configurable modular cards 101, 102, 103 and 104. The plurality of configurable modular cards 101, 102, 103 and 104 are instances of the configurable modular card 100, which has been previously described with reference to FIGS. 1A, 1B and 1C. Although four instances of the configurable modular card 100 have been represented in FIG. 3, the simulator 300 may comprise any number of these cards.

The simulation controller 310 corresponds to the configuration component 210 represented in FIG. 2, but with additional capabilities for managing a distributed simulation and for reconfiguring the configurable modular cards when appropriate.

The simulation controller 310 includes an input/output (I/O) unit 311 and a processor 312. The simulation controller 310 may include additional electronic components, such as additional processors, at least one memory, a bus, a power unit; not represented in FIG. 3 for simplification purposes.

The simulation controller 310 configures the plurality of configurable modular cards 101, 102, 103 and 104. The configuration of instances of the configurable modular card 100 has been previously described with reference to FIGS. 1A, 1B and 1C. Each configurable modular card (e.g. 101) sends a broadcast message to the simulation controller 310. The broadcast message is received by the I/O unit 311 of the simulation controller 310 and transmitted to the processor 312. The processor 312 determines configuration parameters for the configurable modular card (e.g. 101) and transmits the configuration parameters to the I/O unit 311. The I/O unit 311 sends a broadcast response message with the configuration parameters to the configurable modular card (e.g. 101). The broadcast response message is received by the configurable I/O unit 40 of the configurable modular card (e.g. 101).

The configuration parameters are determined based on a pre-defined configuration of the simulator. For instance, as illustrated in FIG. 3, the simulator 300 may comprise two sub-systems 350 and 360. The first sub-system 350 implements a first functionality of the simulator, for example simulating a motion of an aircraft. The second sub-system 360 implements a second functionality of the simulator, for example simulating information displayed on a display. Functionalities may be divided in sub-functionalities and the pre-defined configuration of the simulator determines which configurable modular cards implement which functionalities or sub-functionalities. Examples of systems include: flight control, autopilot system, navigation system, power management system, etc.

The processor 20 of each configurable modular card (e.g. 101) generates the broadcast message sent by its configurable I/O unit 40 to the simulation controller 310.

The processor 20 of each configurable modular card (e.g. 101) executes its I/O configuration code to configure the plurality of inputs and outputs of its configurable input/output unit 40, based on the broadcast response message (comprising the configuration parameters) received by its configurable I/O unit 40.

The processor 20 of each configurable modular card (e.g. 101) executes its power supply configuration code to configure the plurality of power circuits of its power supply 60, based on the broadcast response message (comprising the configuration parameters) received by its configurable I/O unit 40.

The processor 20 of each configurable modular card (e.g. 101) executes a simulation code to implement a functionality of the simulator, the executed simulation code being determined based on the broadcast response message (comprising the configuration parameters) received by its configurable I/O unit 40. The simulation code may decouple the hardware from the software by including tags referring to each hardware component and hardware sub-component which is involved in the simulation. For example, the input/output of the I/O unit 40 to be used is tagged and reference is made to the tag in the simulation code rather than to the input/output themselves. By tagging the hardware components and hardware sub-components involved in the simulation, and referring to the tags in the simulation code, it becomes possible to modify the modular card 100 and the interactions between the modular cards and the other components, by simply re-assigning the tags to other hardware components and hardware sub-components, as needed, and even on the fly or dynamically.

When a specific functionality of the simulator is divided in several sub-functionalities, the processors 20 of several configurable modular cards (e.g. 101 and 102, or alternatively 103 and 104) execute simulation codes implementing the several distributed sub-functionalities of the specific functionality of the simulator.

In the example illustrated in FIG. 3, the first functionality of the simulator implemented by the first sub-system 350 may consist of two distributed sub-functionalities, implemented respectively by the simulation code executed by the processors 20 of the two configurable modular cards 101 and 102. The second functionality of the simulator implemented by the second sub-system 360 may consist of two distributed sub-functionalities, implemented respectively by the simulation code executed by the processors 20 of the two configurable modular cards 103 and 104.

The simulator 300 may comprise more than one simulation controller. For instance, the simulation controller 310 is responsible for controlling the configurable modular cards 101, 102, 103 and 104 of the sub-systems 350 and 360; and another simulation controller (not represented in FIG. 3) may be responsible for controlling the configurable modular cards of at least one other sub-system (not represented in FIG. 3). Furthermore, a simulation controller may be implemented by a configurable modular card 100.

The simulator 300 may also comprise a hierarchy of systems and sub-systems controlled by a hierarchy of simulation controllers. For example, the second sub-system 360 may include at least one lower level sub-system 365. The configurable modular card 103 may implement simulation controller functionality similar to the simulation controller 310. Thus, the configurable modular card 103 is controlled by the simulation controller 310, and controls configurable modular cards (not represented in FIG. 3) of the lower level sub-system 365.

The simulation code executed by the processor 20 of the configurable modular card (e.g. 101) may be initially stored in the memory 30 of the configurable modular card. The simulation code may be divided in software modules implementing the various functionalities and sub-functionalities of the simulator. Thus, the processor 20 may select to execute a particular software module, corresponding to the functionality or sub-functionality specified by the configuration parameters of the received broadcast response message. Alternatively, the particular software module may not be initially stored in the memory 30, and the configurable modular card (e.g. 101) may need to download it, for example from a pre-defined software server or from the simulation controller 310.

As mentioned earlier in reference to FIGS. 1A, 1B, 1C and 2, the configurable I/O unit 40 of a configurable modular card (e.g. 101) is capable of exchanging (receiving and sending) data with at least one other simulation component.

The other simulation component may consist of another configurable modular card 100. For example, the configurable modular cards 101 and 102 exchange data generated by the simulation code executed by the processors 20 of the configurable modular cards 101 and 102. Each modular card 101 and 102 implements a distributed sub-functionality of the global functionality implemented by the sub-system 350. The exchange of data enables a synchronization of the sub-functionalities implemented respectively by the configurable modular cards 101 and 102. Similarly, an exchange of data enables a synchronization of the sub-functionalities implemented respectively by the configurable modular cards 103 and 104. Each modular card 103 and 104 implements a distributed sub-functionality of the global functionality implemented by the sub-system 360. Although not represented in FIG. 3, configurable modular cards of different sub-systems (e.g. 102 and 103) may also exchange data.

The other simulation component may also consist of a dedicated hardware component 320, 321 and 322. A dedicated hardware component such as a display, a light, a mechanical actuator, is under the control of one or several configurable modular cards 100. In this case, the data exchanged there between consist of commands generated by the simulation software executed by the processor 20 of the configurable modular cards 100. The commands are sent to the dedicated hardware component to trigger an event representative of the current state of the simulation. Alternatively, a dedicated hardware component may consist of a sensor, and the data exchanged between the sensor and one or several configurable modular cards 100 consist in data collected by the sensor and sent to the configurable modular card(s).

In the example illustrated in FIG. 3, the functionality implemented by the first sub-system 350 simulates a motion of an aircraft and the functionality implemented by the second sub-system 360 simulates information displayed on a display. The dedicated hardware component 321 is a mechanical actuator for moving a seat in which a trainee is sitting, controlled by the configurable modular card 101. The dedicated hardware component 322 is a light or a set of lights representative of various events occurring during the motion of the aircraft, controlled by the configurable modular card 102. The dedicated hardware component 320 is a display for displaying data, controlled simultaneously by the configurable modular cards 103 and 104. Those skilled in the art will understand that the functionality is not limited to the example of FIG. 3, and other functionalities and sub-systems such as the following could be implemented by the present modular card: vehicle components, aircraft components, avionics equipment, cockpit panels, vehicle panels, etc.

In a particular aspect, the I/O unit 311 of the simulation controller 310 receives a test notification with test results from one (e.g. 101) of the plurality of configurable modular cards. The processor 312 of the simulation controller 310 analyses the test results, determines an operational status of the configurable modular card (e.g. 101), and determines reconfiguration parameters based on the test results and the previously determined configuration parameters. For example, if the configurable modular card 101 in charge of controlling the mechanical actuator 321 is not operating properly, the configurable modular card 102 may be reconfigured to control the actuator 321. The configurable modular card 102 may be reconfigured to only control the actuator 321, or may be reconfigured to simultaneously control the actuator 321 and the light(s) 322. Alternatively, a configurable modular card (e.g. 104) of the other sub-system 360 may be reconfigured to control the actuator 321. Thus, the reconfiguration parameters may affect one or several configurable modular cards (e.g. 102 or 104) of one or several sub-systems (e.g. 350 or 360).

The I/O unit 311 of the simulation controller 310 sends a reconfiguration request with the reconfiguration parameters to the configurable modular card(s) (e.g. 102) which need to be reconfigured.

Upon reception of the reconfiguration request by the configurable I/O unit 40 of a configurable modular card (e.g. 102), its processor 20 executes the input/output configuration code to reconfigure the plurality of inputs and outputs of its configurable I/O unit 40 based on the reconfiguration request. The processor 20 also executes the power supply configuration code to reconfigure the plurality of power circuits of the power supply 60 based on the reconfiguration request. The processor 20 further executes a simulation code to implement a functionality or sub-functionality of the simulator, the executed simulation code being determined based on the reconfiguration request. For example, the processor 20 of the configurable modular card 102 executes simulation code to control the actuator 321 instead of the previously executed simulation code for controlling the light(s) 322.

Referring now to FIG. 6, an example of a simulator comprising a plurality of configurable modular cards for performing a distributed simulation is represented. FIG. 6 illustrates a flight simulator 600 including a simulation controller 610 and a hierarchy of configurable modular cards (631, 632, 641, 642, 652, 661 and 671).

The flight simulator 600 comprises a first sub-system 620 for simulating a first functionality of an aircraft: the engines. The sub-system 620 comprises two lower level sub-systems 630 and 640 for respectively simulating a left engine and a right engine of the aircraft.

The configurable modular cards 631 and 632 are in charge of the simulation of the left engine. The cards 631 and 632 are directly configured and controlled by the simulation controller 610. The cards 631 and 632 control several dedicated hardware components: displays 635, lights 636 (dedicated to the left engine simulation); and cabin actuators 635 (shared between the left and right engine simulation).

The configurable modular cards 641 and 642 are in charge of the simulation of the right engine. The cards 641 and 642 are directly configured and controlled by the simulation controller 610. The cards 641 and 642 control several dedicated hardware components: displays 645, lights 646 (dedicated to the right engine simulation); and cabin actuators 635 (shared between the left and right engine simulation).

The flight simulator 600 comprises a second sub-system 650 for simulating a second functionality of the aircraft: the landing gear. The sub-system 650 comprises two lower level sub-systems 660 and 670 for respectively simulating left wheels and right wheels of the aircraft.

The configurable modular card 652 is in charge of the simulation of the common functionalities of the landing gear sub-system 650. The card 652 is directly configured and controlled by the simulation controller 610. The card 652 control several dedicated hardware components: hydraulic circuits 655 and electric circuits 656.

The simulation sub-controller 651 is in charge of the control of the lower level sub-systems 660 and 670 of the sub-system 650. The simulation sub-controller 651 is directly configured and controlled by the simulation controller 610. The simulation sub-controller 651 may interact with the card 652 to control the lower level sub-systems 660 and 670. The simulation sub-controller functionality 651 may be integrated in the card 652.

The configurable modular card 661 is in charge of the simulation of specific functionalities of the left wheels. The card 661 is configured and controlled by the simulation sub-controller 651. The card 661 controls several dedicated hardware components: lights 665 (dedicated to the left wheels simulation); and cabin actuators 657 (shared between the left and right wheels simulation).

The configurable modular card 671 is in charge of the simulation of specific functionalities of the right wheels. The card 671 is configured and controlled by the simulation sub-controller 651. The card 671 controls several dedicated hardware components: lights 675 (dedicated to the right wheels simulation); and cabin actuators 657 (shared between the left and right wheels simulation).

Configurable Simulator with Integrated Testing Capabilities

Now referring back concurrently to FIGS. 1C and 3, in another aspect, the simulator 300 comprises integrated testing capabilities. The simulation controller 310 manages a series of tests executed by the plurality of configurable modular cards (101, 102, 103 and 104) under its control, and centralizes the results of the tests.

In one embodiment, the configurable modular cards (e.g. 101) have auto-testing capabilities. They autonomously perform a series of tests, and report the test results to the simulation controller 310. The tests are performed by the processor 20 (execution of a testing code) of the configurable modular card (e.g. 101) and the test results are transmitted to the simulation controller 310 via a test notification. The test notification is generated by the processor 20 by aggregating the test results, and is transmitted by the configurable I/O unit 40 of the configurable modular card (e.g. 101).

The I/O unit 311 of the simulation controller 310 receives the test notification, and its processor 312 processes the test results present in the test notification. Processing the specific test results corresponding to a specific configurable modular card (e.g. 101) allows a determination of an operational status of the specific configurable modular card (e.g. 101). Based on the test results received from the plurality of configurable modular cards (101, 102, 103 and 104) under its control, the simulation controller 310 maintains a global operational status of all the configurable modular cards under its control.

As previously described, the simulation controller 310 may trigger a reconfiguration of some of the configurable modular cards (101, 102, 103 and 104) under its control, based on their global operational status. For instance, the configurable modular card 102 may be reconfigured to implement a functionality previously implemented by the configurable modular card 101, due to a failure of the configurable modular card 101 detected by the series of tests performed on this card.

As previously described with reference to FIGS. 1A, 1B and 1C, the testing code executed by the processor 20 of a configurable modular card (e.g. 101) comprises generating testing signals to the plurality of inputs and outputs of its configurable I/O unit 40 configured based on the broadcast response message received by the configurable I/O unit 40. The testing code executed by the processor 20 of a configurable modular card (e.g. 101) also comprises generating testing signals to the plurality of power circuits of the power supply 60 configured based on the broadcast response message received by the configurable I/O unit 40.

Additionally, the testing code executed by the processor 20 of a configurable modular card (e.g. 101) further comprises monitoring the execution of the simulation code executed by the processor 20.

The simulation code executed by the processor 20 implements a functionality of the simulator 300. Functionalities may be divided in several distributed sub-functionalities, each specific sub-functionality being implemented by a specific configurable modular card 100. Thus, monitoring the execution of the simulation code may consist in monitoring the code corresponding to a specific sub-functionality. If a configurable modular card 100 implements several sub-functionalities, the testing code may only monitor a subset of these sub-functionalities.

As previously described, the simulation code executed by the processor 20 of the configurable modular card (e.g. 101) may comprise code for controlling a dedicated hardware component (e.g. 321) by means of control commands sent to this dedicated hardware component (e.g. 321). For example, the dedicated hardware component 321 is a mechanical actuator for moving a seat in which a trainee is sitting. In this case, executing the testing code further comprises generating testing signals to the dedicated hardware component (e.g. 321) to verify that this dedicated hardware component is operating according to the control commands it has received from its controlling configurable modular card (e.g. 101).

In another embodiment, the configurable modular cards (e.g. 101) execute a series of tests determined by the configuration controller 310. The execution of the testing code by the processor 20 of a specific configurable modular card (e.g. 101) is triggered by the reception of a test request received from the simulation controller 310. The test request specifies at least one specific test to be performed via the execution of the testing code by the processor 20. The at least one specific test includes one of: testing the inputs and outputs of the configurable I/O unit 40, testing the plurality of power circuits of the power supply 60, monitoring the execution of the simulation code by the processor 20, and generating testing signals to another simulation component (e.g. 321).

Figure 4:
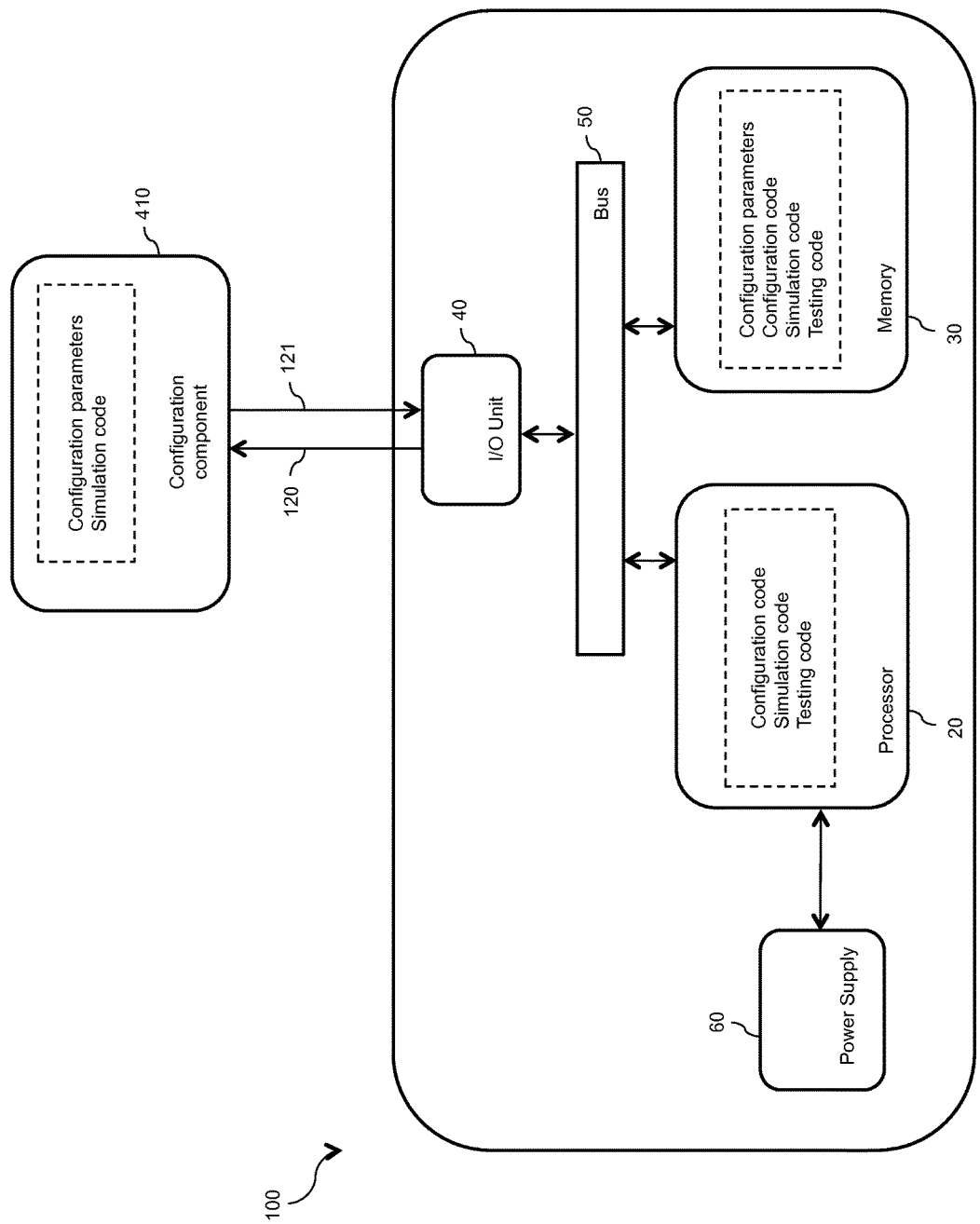
FIG. 4 is a bloc diagram of the configurable modular card of FIG. 1C, according to still another aspect.

Referring now to FIG. 4, a simplified version of the configurable modular card 100 of FIG. 1C is represented, illustrating the configuration parameters and software codes of the card 100. The memory 30 of the card 100 stores configuration parameters, a configuration code, a simulation code and a testing code.

The configuration parameters of the card 100 are initially stored in a memory (not represented in FIG. 4) of a configuration component 410; and transmitted to the memory 30 through the configurable I/O unit 40 of the card 100, via the aforementioned broadcast message 120/broadcast response message 121. The configuration component 410 corresponds to one of: the configuration component 210 represented in FIG. 2 or the simulation controller 310 (having configuration capabilities) represented in FIG. 3.

The simulation code executed by the card 100 is also initially stored in the memory of the configuration component 410, and transmitted to the memory 30 through the configurable I/O unit 40. The aforementioned broadcast message 120/broadcast response message 121 may be used for this purpose. Another transmission mechanism may also be used for this purpose. Alternatively, the simulation code may be initially stored in the memory 30, or transmitted by a software server (not represented in FIG. 4).

The memory 30 stores the configuration code, which is executed by the processor 20 of the card. For instance, the configuration code stored in the memory 30 includes a power supply configuration code, which when executed by the processor 20 configures the power supply 60 of the card 100, based on specific configuration parameters related to the power supply 60 and stored in the memory 30. The configuration code stored in the memory 30 also includes an I/O unit configuration code, which when executed by the processor 20 configures the configurable I/O unit 40, based on specific configuration parameters related to the configurable I/O unit 40 and stored in the memory 30.

The processor 20 executes the simulation code stored in the memory 30. The simulation code may include a plurality of software modules, corresponding to several simulation functionalities and sub-functionalities. The execution of specific software modules, and the order in which they are executed, may be determined by specific configuration parameters related to the simulation flow and stored in the memory 30.

The memory 30 stores the testing code, which is executed by the processor 20. The testing code may be initially stored in the memory 20, or transmitted by the configuration component 410, or by a software server (not represented in FIG. 4). For instance, the testing code stored in the memory 30 includes a power supply testing code, which when executed by the processor 20 tests the power supply 60. The testing code stored in the memory 30 also includes an I/O unit testing code, which when executed by the processor 20 tests the configurable I/O unit 40. The testing code stored in the memory 30 further includes simulation testing code, which when executed by the processor 20 monitors the execution of the simulation code.

Figure 5:
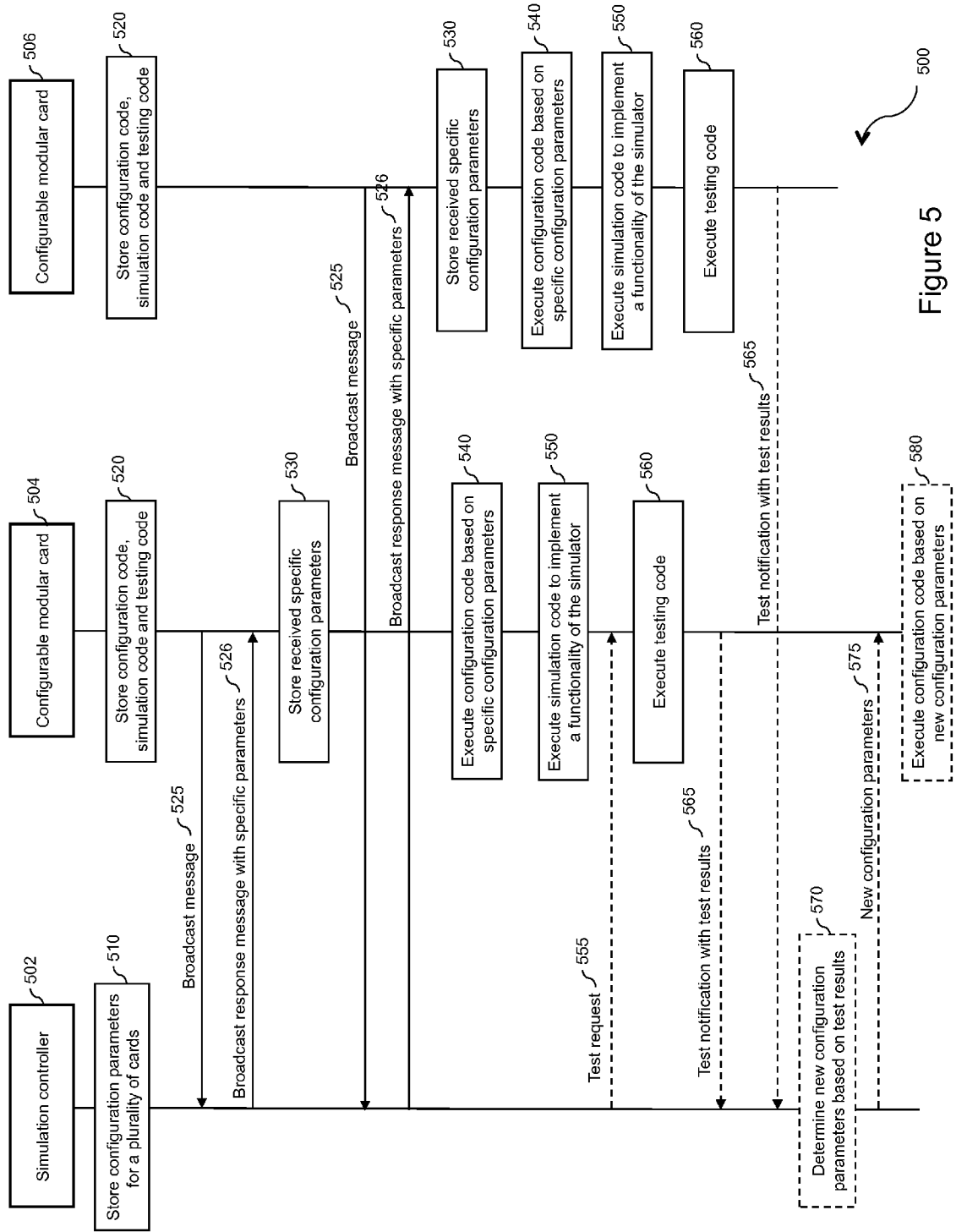
FIG. 5 illustrates a method for operating a configurable simulator including a plurality of the configurable modular cards of FIG. 1C, according to yet another aspect.

Method for Operating a Configurable Simulator Comprising a Plurality of Configurable Modular Cards Referring now concurrently to FIGS. 4 and 5, a method 500 for operating a configurable simulator comprising a plurality of configurable modular cards is represented.

The configurable simulator operated by the method 500 may correspond to the simulator 200 previously described in relation to FIG. 2 and/or to the simulator 300 previously described in relation to FIG. 3. The configurable simulator comprises a plurality of configurable modular cards corresponding to the cards 100 previously described in relation to FIGS. 1A, 1B, 1C and 4. For simplification purposes, only two configurable modular cards 504 and 506 are represented in FIG. 5, but the simulator may include any number of configurable modular cards. A simulation controller 502 is represented in FIG. 5, corresponding to the configuration components 210 and 410 previously described in relation to FIGS. 2 and 4, and/or to the simulation controller 310 previously described in relation to FIG. 3. The simulation controller 502 may be integrated to the configurable simulator, or may be an external component in communication with the configurable simulator by means of a communication protocol such as the Ethernet protocol or the Wi-Fi protocol.

The method 500 comprises storing 510 configuration parameters for the plurality of configurable modular cards (504 and 506) in a memory (not represented) of the simulation controller 502.

The method 500 comprises storing 520 a configuration code, a simulation code and a testing code in a memory 30 of the plurality of configurable modular cards (504 or 506). In a particular aspect, at least one of the configuration code, the simulation code and the testing code may be stored in a memory of the simulation controller 502 and transmitted from the simulation controller 502 to the card (504 or 506). Alternatively, the codes are initially present in the memory 30 of the card (504 or 506).

The method 500 comprises transmitting specific configuration parameters for a specific card (504 or 506) from the simulation controller 502 to the card (504 or 506). Thus, each card (504 or 506) may have its own specific configuration parameters, generated and stored at the simulation controller 502. In a particular aspect, transmitting the specific configuration parameters comprises sending 525 a broadcast message from the card (504 or 506) to the simulation controller 502, and receiving 526 a broadcast response message with the specific configuration parameters from the simulation controller 502 at the card (504 or 506).

The method 500 comprises storing 530 the received specific configuration parameters in the memory 30 of the card (502 or 504).

The method 500 comprises executing 540 the configuration code by a processor 20 of the card (504 or 506) based on the specific configuration parameters of the card.

Executing the configuration code includes configuring a plurality of inputs and outputs of a configurable input/output (I/O) unit 40 of the card (504 or 506) based on the specific configuration parameters of the card.

In a particular aspect, configuring the plurality of inputs and outputs of the configurable I/O unit 40 comprises performing a network configuration of the inputs and outputs.

In another particular aspect, the configurable I/O unit 40 exchanges data with at least one other simulation component. Configuring the plurality of inputs and outputs of the configurable I/O unit 40 may comprise determining which inputs and outputs exchange the data with the at least one other simulation component. The at least one other simulation component may be another configurable modular card. For instance, the cards 504 and 506 may exchange data via their respective I/O units 40. Alternatively, the at least one other simulation component may be a dedicated hardware component (not represented in FIG. 5) controlled by the card (502 or 504). The dedicated hardware component may be one of the following: a sensor, a display, a light, a switch, a mechanical actuator, a pneumatic actuator, a hydraulic actuator, an electric component, etc.

Executing the configuration code also includes configuring a plurality of power circuits of a power supply 60 of the card (504 or 506) based on the specific configuration parameters of the card.

In a particular aspect, configuring the plurality of power circuits of the power supply 60 comprises determining at least one of: a specific amperage and a specific voltage of the power delivered by the specific power circuit to an electronic component. The electronic component may be located on the card (504 or 506) or on a dedicated hardware component controlled by the card.

The method 500 comprises executing 550 the simulation code by the processor 20 of the card (504 or 506) to implement a functionality of the simulator. Executing the simulation code to implement a functionality of the simulator may comprise at least one of: simulating information shown on a display, simulating a motion of an aircraft, simulating electric circuits of an aircraft, simulating hydraulic circuits of an aircraft. The simulation code executed by the processor 20 may also comprise code for controlling the aforementioned dedicated hardware component(s).

In a particular aspect, several configurable modular cards (e.g. 504 and 506) receive specific configuration parameters from the simulation controller 502 for configuring their respective processors 20 to execute simulation codes implementing several distributed sub-functionalities of a particular functionality of the simulator.

The memory 30 of the card (504 or 506) may store a plurality of simulation codes corresponding to several functionalities of the simulator. Executing the configuration code may further comprise determining the simulation code executed by the processor 20 among the plurality of simulation codes stored in the memory 30 based on the specific configuration parameters of the card.

The method 500 comprises executing 560 the testing code by the processor 20 of the card (504 or 506).

Executing the testing code includes generating testing signals to the plurality of inputs and outputs of the configurable I/O unit 40 configured based on the specific configuration parameters of the card (504 or 506).

In a particular aspect, the testing signals generated to the plurality of inputs and outputs of the configurable I/O unit 40 allow a verification of the network configuration of the inputs and outputs.

In another aspect, the testing signals generated to the plurality of inputs and outputs of the configurable I/O unit 40 allow a verification of the network connectivity of the inputs and outputs with another simulation component (e.g. another configurable modular card or a dedicated hardware component).

Executing the testing code also includes generating testing signals to the plurality of power circuits of the power supply 60 configured based on the specific configuration parameters of the card (504 or 506).

In a particular aspect, the testing signals generated to the plurality of power circuits of the power supply 60 allow a verification that the power circuits are operating at a specified voltage or amperage.

Executing the testing code further includes monitoring the execution of the simulation code by the processor 20 of the card (504 or 506).

The method 500 may comprise generating by the processor 20 of the card (504 or 506) a test notification sent 565 by the configurable I/O unit 40 of the card to the simulation controller 502 with test results of the testing code executed by the processor 20 of the card.

The method 500 may also comprise determining 570 at the simulation controller 502 new configuration parameters for at least one of the plurality of configurable modular cards (e.g. 504) based on the received test results. The new configuration parameters are sent 575 to each of the impacted cards (e.g. 504). Then, each impacted card (e.g. 504) executes 580 its configuration code based on the received new configuration parameters and reconfigures itself.

The method 500 may further comprise triggering 555 the execution of the testing code at a card (e.g. 504) by the reception of a test request from the simulation controller 502.

The present disclosure has introduced a configurable simulator comprising a plurality of configurable modular cards. The usage of these cards introduces a great deal of flexibility in the operations of the simulator. Each card being individually configurable (and reconfigurable), the simulator can be easily (re)-configured to accommodate an addition of card(s), a removal of card(s), a replacement of card(s). The simulator can also be reconfigured to adapt to one or several of its cards being out of order. Configuring or reconfiguring the simulator consists in configuring or reconfiguring one or several of its cards. Thus, a complete simulator, or a sub-system of a complete simulator, may be designed based on a set of configurable modular cards. The set of configurable modular cards is delivered as a set of generic cards having a common hardware and no initial specific hardware and software configuration. The set of configurable modular cards is then configured as illustrated in the present disclosure, to implement the multiple functionalities of a complete simulator, or alternatively to implement a particular functionality of a sub-system of a complete simulator.

Although the present disclosure has been described hereinabove by way of non-restrictive, illustrative embodiments thereof, these embodiments may be modified at will within the scope of the appended claims without departing from the spirit and nature of the present disclosure.

What is claimed is:

1. A configurable input/output unit comprising:
   a plurality of configurable inputs and outputs comprising:
      several outputs capable of sending a broadcast message to a configuration device and several inputs capable of receiving a broadcast response message from the configuration device;
      a predefined output for sending the broadcast message to the configuration device; and
      a predefined input for receiving the broadcast response message from the configuration device,
   wherein the broadcast message comprises a configuration request and the broadcast response message comprises configuration data for configuring the plurality of configurable inputs and outputs;
   wherein the broadcast message allows a determination by the configuration device that the configuration device is an intended recipient of the configuration request; and
   wherein the configuration request comprises an identifier, the identifier comprising an identification of the predefined input of the configurable input/output unit for allowing transmission of the broadcast response message by the configuration device to the predefined input of the configurable input/output unit.

2. The configurable input/output unit of claim 1, wherein the configuration data comprise configuration determined parameters based on the identifier.

3. The configurable input/output unit of claim 1, comprising at least one of the following: an Ethernet board, a Wi-Fi board, a cellular board, a USB board, a Control Area Network bus, and an HDMI board.

4. The configurable input/output unit of claim 1, further comprising a switch for performing at least one of the following: switching, multiplexing and de-multiplexing signals exchanged between at least one of the plurality of configurable inputs and outputs and at least one computing device.

5. A configurable modular card comprising:
   a board;
   at least one processor mounted on the board;
   at least one memory mounted on the board and in electronic communication with the processor;
   the configurable input/output unit of claim 1;
   a bus electronically connected with the configurable input/output unit, the at least one processor and the at least one memory for providing electronic data exchange there between;
   input/output configuration code stored in the memory, the input/output configuration code when executed by the at least one processor configures the plurality of inputs and outputs of the configurable input/output unit based on the configuration data of the broadcast response message.

6. The configurable modular card of claim 5, wherein the configuration data comprise configuration parameters determined based on the identifier.

7. The configurable modular card of claim 5, wherein configuring the plurality of inputs and outputs of the configurable input/output unit based on the configuration data of the broadcast response message comprises performing a network configuration of the inputs and outputs.

8. The configurable modular card of claim 5, wherein the configurable input/output unit exchanges data with at least one computing device, and configuring the plurality of inputs and outputs of the configurable input/output unit based on the configuration data of the broadcast response message comprises determining which inputs and outputs exchange the data with the at least one computing device.

9. The configurable modular card of claim 5, further comprising:
   input/output testing code stored in the memory, the input/output testing code when executed by the at least one processor generates testing signals for testing the plurality of inputs and outputs of the configurable input/output unit configured based on the configuration data of the broadcast response message.

10. The configurable modular card of claim 9, wherein the testing signals generated for testing the plurality of inputs and outputs of the configurable input/output unit allow a verification of the network configuration of the inputs and outputs.

11. The configurable modular card of claim 9, wherein the testing signals generated for testing the plurality of inputs and outputs of the configurable input/output unit allow a verification of a network connectivity of the inputs and outputs with at least one computing device.

12. The configurable modular card of claim 9 adapted for use in a simulator, further comprising:
   a power supply, the power supply receiving an entry power of a predetermined voltage and comprising a plurality of configurable power supply circuits;
   power supply configuration code stored in the memory, the power supply configuration code when executed by the at least one processor configures the plurality of power circuits of the power supply based on the configuration data for configuring the power supply comprised in the broadcast response message;
   power supply testing code stored in the memory, the power supply testing code when executed by the at least one processor generates testing signals for testing the plurality of power circuits of the power supply configured based on the configuration data of the broadcast response message.

13. The configurable modular card of claim 12, wherein the at least one processor executes a simulation code to implement a functionality of the simulator.

14. The configurable modular card of claim 13, wherein executing the simulation code to implement the functionality of the simulator comprises at least one of: processing data received by the configurable input/out unit and generating data sent by the configurable input/output unit.

15. The configurable modular card of claim 13, wherein the functionality of the simulator comprises at least one of: simulating information shown on a display, simulating a motion of an aircraft, simulating electric circuits of an aircraft, simulating hydraulic circuits of an aircraft.

16. The configurable modular card of claim 13, wherein the functionality of the simulator comprises several sub-functionalities and configuring the plurality of inputs and outputs of the configurable input/output unit based on the configuration data of the broadcast response message comprises determining which inputs and outputs are used to receive and send data related to a specific sub-functionality.

17. The configurable modular card of claim 6, wherein the identifier further comprises an identification of the configurable module card.

18. The configurable modular card of claim 5, wherein the predefined output and the predefined input are stored in the memory.

19. The configurable input/output unit of claim 1, wherein the identification of the predefined input comprises at least one of the following: an Ethernet address of the predefined input, and an Internet Protocol (IP) address of the predefined input.

20. The configurable modular card of claim 5, wherein the identification of the predefined input comprises at least one of the following: an Ethernet address of the predefined input, and an Internet Protocol (IP) address of the predefined input.

* * * * *